United States Patent
König et al.

(10) Patent No.: US 8,822,807 B2
(45) Date of Patent: Sep. 2, 2014

(54) METHOD FOR PRODUCING A THERMOELECTRIC COMPONENT AND THERMOELECTRIC COMPONENT

(75) Inventors: Jan König, Freiburg (DE); Uwe Vetter, Müllheim (DE); Carsten Matheis, Spiesen-Elversberg (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 740 days.

(21) Appl. No.: 12/842,065

(22) Filed: Jul. 23, 2010

(65) Prior Publication Data

US 2011/0023930 A1    Feb. 3, 2011

Related U.S. Application Data

(63) Continuation of application No. PCT/EP2008/010480, filed on Dec. 10, 2008.

(30) Foreign Application Priority Data

Jan. 23, 2008   (DE) .......................... 10 2008 005 694

(51) Int. Cl.
*H01L 35/34* (2006.01)
*H01L 35/08* (2006.01)

(52) U.S. Cl.
CPC ................ *H01L 35/08* (2013.01); *H01L 35/34* (2013.01)
USPC ........... 136/201; 136/205; 136/203; 136/212; 438/54

(58) Field of Classification Search
USPC ..................... 136/201, 205, 203, 212; 438/54
See application file for complete search history.

(56) References Cited

U.S. PATENT DOCUMENTS

| | | | | |
|---|---|---|---|---|
| 3,842,489 A | * | 10/1974 | Bustard .......................... | 136/201 |
| 3,874,935 A | * | 4/1975 | Goslee et al. .................. | 136/202 |
| 4,007,061 A | * | 2/1977 | Le Couturier ................. | 136/221 |
| 4,855,810 A | | 8/1989 | Gelb et al. | |
| 5,429,680 A | | 7/1995 | Fuschetti | |
| 5,464,485 A | * | 11/1995 | Hall, Jr. ......................... | 136/230 |
| 5,594,609 A | * | 1/1997 | Lin ................................ | 361/104 |

(Continued)

FOREIGN PATENT DOCUMENTS

| | | |
|---|---|---|
| DE | 102006055120 A1 | 5/2008 |
| SU | 169620 A1 | 6/1965 |
| WO | 2007/002337 A2 | 1/2007 |

OTHER PUBLICATIONS

International Search Report issued on Feb. 4, 2010 in International Application No. PCT/EP2008/010480.

(Continued)

*Primary Examiner* — Golam Mowla
(74) *Attorney, Agent, or Firm* — Panitch Schwarze Belisario & Nadel LLP

(57) ABSTRACT

A method is provided for producing a thermoelectric component having at least one pair of thermoelectric legs, including an n-leg and a p-leg, wherein both legs are welded to an electrically conductive contact material, and wherein the n-leg and the p-leg of the pair of legs are welded in separate welding steps to the contact material. A thermoelectric component produced by the method is also provided.

26 Claims, 10 Drawing Sheets

(56) References Cited

U.S. PATENT DOCUMENTS

| | | | |
|---|---|---|---|
| 6,005,182 A * | 12/1999 | Imanishi et al. | 136/201 |
| 6,686,532 B1 * | 2/2004 | Macris | 136/204 |
| 8,013,235 B2 * | 9/2011 | Takahashi | 136/205 |
| 2004/0042181 A1 | 3/2004 | Nagasaki | |
| 2007/0240751 A1 * | 10/2007 | Takahashi | 136/205 |
| 2008/0060693 A1 * | 3/2008 | Sterzel | 136/203 |
| 2008/0121263 A1 | 5/2008 | Schutte et al. | |
| 2010/0319744 A1 * | 12/2010 | Smythe et al. | 136/201 |
| 2011/0023930 A1 * | 2/2011 | Konig et al. | 136/212 |

OTHER PUBLICATIONS

English translation of an Office Action issued Oct. 29, 2013 in JP Application No. 2010-543384.

Office Action issued Feb. 4, 2014 in CA Application No. 2,712,254.

* cited by examiner

METHOD FOR PRODUCING A THERMOELECTRIC COMPONENT AND THERMOELECTRIC COMPONENT

CROSS-REFERENCE TO RELATED APPLICATIONS

This application is a continuation of International Application No. PCT/EP2008/010480, filed Dec. 10, 2008, which was published in the German language on Jul. 30, 2009, under International Publication No. WO 2009/092421 A2 and the disclosure of which is incorporated herein by reference.

BACKGROUND OF THE INVENTION

The present invention relates to a method for producing a thermoelectric component comprising at least one pair of thermoelectric legs, including an n-leg and a p-leg, both legs being welded to an electrically conductive contact material. Furthermore, the present invention relates to a thermoelectric component.

The mode of operation of a thermoelectric component is based on the thermoelectric effect, which is also called Seebeck effect and Peltier effect, respectively. The field of application of the present invention is thus thermoelectrics. A thermoelectric component can be used on the one hand for generating energy as a thermoelectric generator and on the other hand for temperature control as a Peltier element. A third field of application for thermoelectric components are sensors—for example, thermoelements and thermocolumns.

In a thermoelectric generator, voltage and thus electric current is generated by way of a temperature difference. Inversely, in a Peltier element, one side of the thermoelectric component is heated by applying voltage and due to the resulting flow of current, and the other side of the thermoelectric component is cooled. When the thermoelectric component is used as a temperature sensor, a change in temperature is detected via a change in voltage at the output of the thermoelectric component.

FIG. 1 shows the basic structure of a thermoelectric component 1. In principle, such a thermoelectric component 1 is composed of pairs of thermoelectric legs with n-legs 2 and p-legs 3. These n- and p-legs 2, 3 are n- and p-conducting materials, as are also used in other fields of semiconductor technology. Due to an electrically conductive contact material 4 the n-legs 2 and the p-legs 3 are alternatingly contacted with one another. Thus the n- and p-legs 2, 3 are connected electrically in series and thermally in parallel. The pair of thermoelectric legs and the electrically conductive contact material 4 are provided between layers of an electrically insulating substrate 5.

As is schematically shown in FIG. 1, there is a temperature gradient from "hot" to cold" between an upper side of the thermoelectric component 1 and a lower side of the thermoelectric component 1. Due to this temperature gradient it is possible to use the thermoelectric component 1 as a thermoelectric generator so that voltage is applied between the outputs of the thermoelectric component. This is illustrated by the "minus" and the "plus" sign in FIG. 1

However, it is equally possible, with the same structure in FIG. 1, to generate a temperature gradient between the upper side and the lower side of the thermoelectric component 1 by applying an external voltage and with the current flowing in the circuit through the thermoelectric component. The thermoelectric component 1 is thus used as a Peltier element.

To contact the pairs of thermoelectric legs with the electrically conductive contact material 4, soldering methods or mechanical methods may be employed, for example.

In the soldering process a soldering paste or a liquid solder is normally applied in a screen-printing method. Alternatively, a solder can be applied by way of foil-shaped parts. Further solder coatings are formed by means of vaporization, sputtering, plasma spraying or electroplating methods.

Contacting by means of soldering methods has the drawback that the softening point of the solder must be higher than the operating temperature of the thermoelectric component. If the softening point of the solder is below the operating temperature of the thermoelectric component, the field of application of the thermoelectric component is restricted because at elevated temperatures the contact connections may fuse and the component may thereby get destroyed. Solders for thermoelectric applications in the range between 300° C. and 450° C. are not available.

Moreover, at operating temperatures above 250° C. the solders that can be used for thermoelectric components show further defects such as brittleness. As a rule, an additional electrical and thermal resistance that further reduces the efficiency of the thermoelectric component is inevitably created by the solder layer.

In mechanical bonding methods, e.g. sintering electrically conductive braiding into thermoelectric material or pressing electrical contacts against the thermoelectric material, the complicated manufacture of the thermoelectric components is disadvantageous. Moreover, mechanically pressed contacts show poor electrical and thermal properties, whereby the efficiency of such thermoelectric components is reduced.

BRIEF SUMMARY OF THE INVENTION

It is the object of the present invention to provide a method for producing a thermoelectric component by which legs can be contacted with the thermoelectrically conductive contact material at low costs and in a safe way, and also an efficient thermoelectric component.

According to the invention this object is achieved with a method for producing a thermoelectric component with at least one pair of thermoelectric legs, including an n-leg and a p-leg, wherein both legs are welded to an electrically conductive contact material, wherein the n-leg and the p-leg of the pair of legs are welded in separate welding steps to the contact material.

A physicochemical reaction depending on the welding parameters and materials occurs in this process, wherein the contact material or a layer positioned thereon joins the leg material or a reaction layer positioned thereon.

Apart from the ease of automation of the whole method it is thereby possible to optimize welding methods, welding tools and welding parameters with respect to the respective leg properties and the electrically conductive contact material to be joined. Since the thermal load that arises during welding of the individual legs lasts for a short period of time only, the thermoelectric properties of the leg materials do not change. To be more specific, material does not evaporate or oxidize.

Preferably, the welding parameters for welding the n-leg and the welding parameters for welding the p-leg are set to be independent of one another. It is thereby possible to select for each leg material to be welded or for each material pair of leg material and contact material to be welded the optimum parameter settings, such as flow of current and/or hold time and/or bias current and/or heating-up period and/or contact pressure for the welding process.

According to a preferred embodiment the legs are provided at one of their ends in longitudinal direction with contact surfaces that are brought into contact with the contact material, and the welding of the n-leg and/or the welding of the p-leg is performed on the contact surface and/or at the side of the contact surface of the respective leg. This creates a maximally possible contact surface between the electrically conductive contact material and the contact surfaces of the respective leg, resulting in a low contact resistance of the thermoelectric component.

According to a further preferred embodiment the contact material is pressed by at least one welding electrode onto the leg to be welded, either before and/or during the respective welding step. A separate fixation of the electrically conductive contact material is thus not needed.

Preferably, the n-leg and the p-leg of the pair of legs are welded by gap welding to the contact material.

Further preferably, the contact material is brought into contact with the corresponding leg and a gap of a gap electrode contacting the contact material is set in conformity with a width of the leg to be welded. This permits an exact energy input for forming the welded joint.

Likewise, it is possible that the contact material is brought into contact with the corresponding leg, and that a gap of a gap electrode contacting the contact material is set to be wider than a width of the leg to be welded.

Preferably, the contact material encloses an end of the leg to be welded at least partly in a radial direction of the leg, and the gap electrode contacts the contact material in a radial direction of the leg to be welded. It is thereby possible that the energy input for welding takes place from the side, wherein the gap electrode can be placed on or pressed against the contact material.

According to a further preferred embodiment the legs to be welded and/or the contact material are preheated prior to welding. This prevents stresses in the material caused by thermal shock.

According to a further preferred embodiment the thermoelectric component comprises a plurality of pairs of legs, wherein among a selection of pairs of legs first the n-legs and then the corresponding p-legs are welded to the contact material. It is equally possible that the thermoelectric component comprises a plurality of pairs of legs, wherein among a selection of pairs of legs first the p-legs and then the corresponding n-legs are welded to the contact material. With both options several n-legs and several p-legs, respectively, can thus be welded in parallel, whereby the time needed for producing the thermoelectric component is shortened.

It is particularly preferred when the thermoelectric component comprises a plurality of pairs of legs and all of the n-legs are simultaneously welded to the contact material. Likewise, it is particularly preferred when the thermoelectric component comprises a plurality of pairs of legs, and all of the p-legs are simultaneously welded to the contact material. The time needed for producing the thermoelectric component is thus minimized if first all of the n-legs and then all of the p-legs are welded, or vice versa.

Furthermore, it is possible that all of the n- and p-legs are welded separately, but simultaneously to the contact material.

According to the invention the above-mentioned object is further achieved by a thermoelectric component, produced according to at least one aforementioned method, comprising at least one pair of thermoelectric legs which includes an n-leg and a p-leg and which is welded to at least one electrically conductive contact material.

According to an embodiment of the invention the above-mentioned object is further achieved by a thermoelectric component comprising at least one pair of thermoelectric legs which includes an n-leg and a p-leg and which is welded to at least one electrically conductive contact material, the electrically conductive contact material being coated. This ensures a particularly reliable electrical connection between the legs and the contact material.

The above-mentioned object is further achieved according to an embodiment of the invention by a thermoelectric component comprising at least one pair of thermoelectric legs which includes an n-leg and a p-leg and which is welded to at least one electrically conductive contact material, the legs having different dimensions. Depending on its field of application, the thickness of the thermoelectric component can thus be varied, so that the thermoelectric component can be used efficiently.

According to another embodiment of the invention the above-mentioned object is further achieved by a thermoelectric component comprising at least one pair of thermoelectric legs which includes an n-leg and a p-leg and which is welded to at least one electrically conductive contact material, wherein the electrically conductive contact material encloses an end of the welded leg at least in part in radial direction thereof. The contact surface between the contact material and the leg is thereby increased and the contact resistance is reduced.

According to a further embodiment of the invention the above-mentioned object is moreover achieved by a thermoelectric component comprising at least one pair of thermoelectric legs which includes an n-leg and a p-leg and which is welded to at least one electrically conductive contact material, the electrically conductive contact material being welded in the longitudinal direction of the welded leg to a contact surface thereof. This thermoelectric component also comprises a large-area contact surface between the contact material and the respective leg, whereby low contact resistance is achieved.

Preferably, the electrically conductive contact material is coated with an electrically conductive material.

According to a further preferred embodiment the thermoelectric component comprises a plurality of pairs of legs, which legs are connected via the contact material electrically in series and thermally in parallel. This yields compact thermoelectric components of high efficiency.

Preferably, the n- and p-legs of a pair of legs are electrically interconnected at one side of the thermoelectric component via the contact material, and the n-leg of the above-mentioned pair of legs is connected at the opposite side of the thermoelectric component to another neighboring p-leg, and the p-leg of the above-mentioned pair of legs is electrically connected to another neighboring n-leg.

Preferably, a mechanical stabilization is provided between neighboring legs. Such a thermoelectric component is very robust and can also be used in vibrating environments without failure of the welded joints.

According to a further preferred embodiment at least one of the legs is provided at one or both ends or on the faces with at least one additional layer as a diffusion barrier and/or adhesive layer and/or for reducing the transition resistance to the contact material. It is also possible that the contact material comprises at least one additional layer as the diffusion barrier and/or adhesive layer and/or for reducing the transition resistance to the respective leg.

Preferably, the thermoelectric component is mechanically flexible. While solder connections tend to break relatively rapidly under bending stresses, welded joints are much more resistant, so that a flexible thermoelectric component can be adapted to different environments, e.g. to neighboring thermoconductors.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

Figure 1:
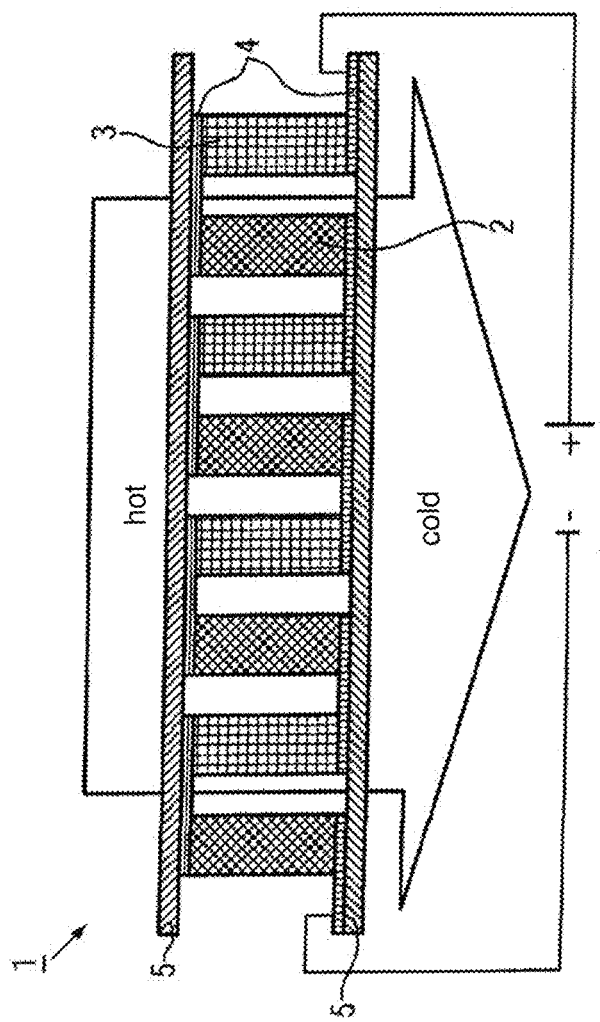
FIG. 1 is a schematic illustration showing a basic structure of a thermoelectric component for explaining the functional principle.

In the subsequent description, like reference numerals are used for like features, and for reasons of a clear illustration reference numerals are not always indicated in the figures for all similar features, particularly for all legs of the various embodiments of thermoelectric components 1. Rather, only individual legs are provided by way of example with the respective reference numerals.

DETAILED DESCRIPTION OF THE INVENTION

Figure 2:
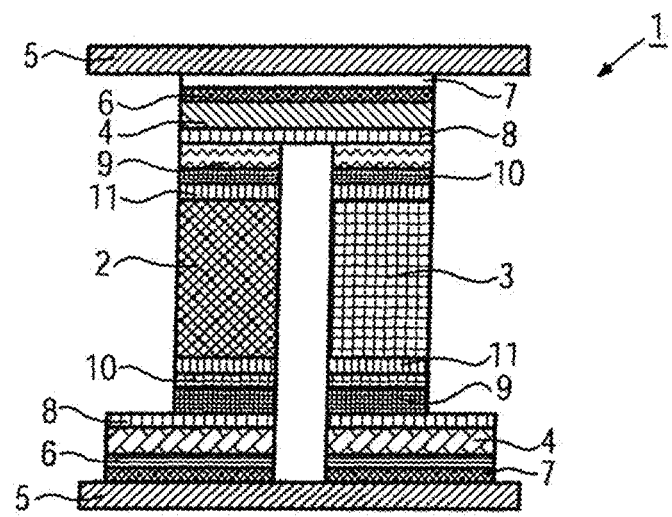
FIG. 2 is a schematic illustration showing a pair of legs of a thermoelectric component.

Beside FIG. 1, which has already been described in the introduction to the specification, FIG. 2 is a schematic illustration showing a preferred embodiment of a pair of legs of a thermoelectric component 1.

The thermoelectric component 1 in FIG. 2 comprises a pair of legs, consisting of an n-leg 2 and a p-leg 3. The n-leg 2 and the p-leg 3 are electroconductively contacted with electrically conductive contact material 4 by means of welds. In the upper area of FIG. 2, the two legs 2, 3 are interconnected by a strip of electrically conductive contact material 4. In the lower area of FIG. 2, each of the two legs 2, 3 is connected to a separate strip of electrically conductive contact material 4.

A voltage can already be tapped on the last-mentioned strip if the thermoelectric component 1 is a thermoelectric generator or a temperature sensor. As an alternative, contacting with a source of current can already be carried out at the places if the thermoelectric component 1 is used as a Peltier element.

According to a preferred embodiment the electrically conductive contact materials 4 in the lower area of FIG. 2 are however electrically conductively connected to further neighboring legs 2, 3. This means that in FIG. 2 the n-leg 2 is connected at its left side to a further p-leg (not shown) whereas the p-leg 3 at its right side is electroconductively connected to a further n-leg (not shown). Apart from FIG. 1, such arrangements are also found in FIGS. 3 to 5, which are described hereinafter.

Hence, the n- and p-legs 2, 3 of the pair of legs shown in FIG. 2 are electrically interconnected via the contact material 4 on the upper side of the thermoelectric component 1. At the opposite lower side of the thermoelectric component 1 the n-leg 2 of the illustrated pair of legs is preferably connected to another neighboring p-leg (not shown), and the p-leg 3 of the illustrated pair of legs is preferably connected to another neighboring n-leg (not shown). As a result, the individual legs 2, 3 are connected via the contact material 4 electrically in series and thermally in parallel. Preferably, the thermoelectric component 1 comprises a plurality of pairs of legs, of which legs 2, 3 are connected via the contact material electrically in series and thermally in parallel, and the respective legs 2, 3 can here be contacted with each other in different spatial directions.

In the illustrated embodiments, the shape of legs 2, 3 is substantially block-shaped, but other forms of the legs are also possible, e.g. rotation-symmetrical, particularly round, cross-sections of the legs. The dimensions of the legs 2, 3 can be varied at random.

Preferably, at least one of the legs 2, 3 is provided at one or both ends or on the faces with at least one additional layer. For instance, this may be a layer for reducing the transition resistance 9 and/or a diffusion barrier 10 and/or an adhesive layer 11. These layers may be applied in different sequences and thicknesses to the respective legs 2, 3 particularly on the contact surfaces thereof relative to the contact material 4. For instance, an electroplating method is suited for the application.

Preferably, the electrically conductive contact material 4 may be coated in addition or alternatively with one or more layers. These may be a separate metallization 7 and/or further diffusion barriers 6, 8. In the illustrated embodiment the electrically conductive contact material 4 comprises an interior diffusion barrier 8 relative to the respective n- and p-legs 2, 3 next to an additional metallization 7, and an exterior diffusion barrier 6 between the metallization 7 and the electrically conductive contact material 4 proper. A separate adhesive layer is also possible, where all layers can be arranged in different sequences. Again, an electroplating method is preferably suited for applying the layers to the contact material 4.

A mechanically stable and also an electrically and thermally highly conductive connection can be established by providing additional layers on the electrically conductive contact material 4 and/or the legs 2, 3. Moreover, these coats serve to reduce the thermal and electrical transition resistance and to eliminate other objectionable effects, such as thermal and mechanical strains. To be more specific, the thermal expansion coefficient can be adapted by matching the respective layers in their material composition. Moreover, on the electrically conductive contact material 4 it is also possible to provide an insulation layer for electrically insulating the areas around the leg contact points, particularly in the case of very thin thermoelectric components 1.

Furthermore, FIG. 2 shows an optional substrate 5 which electrically insulates the thermoelectric component 1 to the exterior. However, it is also possible that the thermoelectric component 1 is open to the outside, e.g., when an adjoining thermoconductor 12 itself is made of an electrically insulating material.

Preferably, the n- and p-legs 2, 3 comprise at least one of the following elements or a composition of the following elements: Ta, W, Mo, Nb, Ti, Cr, Pd, V, Pt, Rh, Re, Cu, Ag, Ni, Fe, Co, Al, In, Sn, Pb, Te, Sb, Bi, Se, S, Au, Zn, Si and Ge. It is advantageous when the legs 2, 3 substantially have compositions comprising elements of the fourth and sixth main group, particularly any desired combinations of [Pb, Sn, Ge] and [S, Se, Te], such as PbTe, PbSe, PbS, SnTe, GeTe and GeSe. Preferably, at least one of the legs 2, 3 comprises a chalcogenide-based material.

Likewise, it is possible that the n- and p-legs 2, 3 substantially comprise compositions consisting of elements of the fifth and sixth main group, particularly compositions of [Bi, Sb]$_2$ and [S, Se, Te]$_3$, such as Bi$_2$S$_3$, Bi$_2$Te$_3$, Bi$_2$Se$_3$, Sb$_2$S$_3$, Sb$_2$Se$_3$ and Sb$_2$Te$_3$.

Likewise, it is possible that the legs 2, 3 comprise SiGe-based materials, skutterudite-based materials, half-Heusler-based materials, oxide-based materials, antimony-based materials, clathrate-based materials or boron-based materials.

It is also advantageous when the n- and p-legs 2, 3 comprise materials of the carbon group, i.e. the fourth main group of the Periodic system, also in composition, i.e. C, Si, Ge, Sn and Pb. Nanocomposites also seem to be of advantage to legs 2, 3.

The following elements or a composition of the following elements are preferred for the electrically conductive material 4: Ta, W, Mo, Nb, Ti, Cr, Pd, V, Pt, Rh, Re, Cu, Ag, Ni, Fe, Co, Al, In, Sn, Pb, Te, Sb, Bi, Se, S, Au, Zn, Si and Ge. This is also true for the coatings of the contact material 4.

It is particularly advantageous when the contact material 4 comprises a strip or wire of Ta, W, Mo, Nb, Ti, Cr, Pd, V, Pt, Rh, Re, Cu, Ag, Ni, Fe, Co, Al, In, Sn, Pb, Te, Sb, Bi, Se, S, Au, Zn, Si or Ge alone or in combination with one or several other elements. Possible are also several strips or wires of contact material 4 that are placed one on top of the other or side by side. Likewise, it is possible that a layer applied to the contact material comprises one or more of the aforementioned elements. This may particularly be a reaction layer that reacts physico-chemically with the respective leg 2, 3 and/or a reaction layer positioned on the leg during welding.

Preferably, all of the n-legs 2 and p-legs 3 are welded to the corresponding strips or wires of electrically conductive contact material 4. However, it is also possible that the legs 2, 3 are only welded at one side of the thermoelectric component 1 to the strips or wires of electrically conductive contact material 4, e.g. on the upper side with respect to FIG. 2. At the opposite side the legs 2, 3 may also be connected by another joining method (solder method, mechanical joining method) to the respective strips or wires of the electrically conductive contact material 4.

Preferably, the n- and p-legs 2, 3 may have different dimensions so as to adapt the thermoelectric component 1 to different environments. It is also advantageous when the electrically conductive contact material 4 in the longitudinal direction L of the respective leg 2, 3 is fully welded to a contact surface, particularly face, thereof. Furthermore, it is advantageous when the electrically conductive contact material 4 encloses an end of the welded leg 2, 3 at least in part in the radial direction R thereof. The aforementioned embodiments may also be combined with one another in any desired way.

Figure 3:
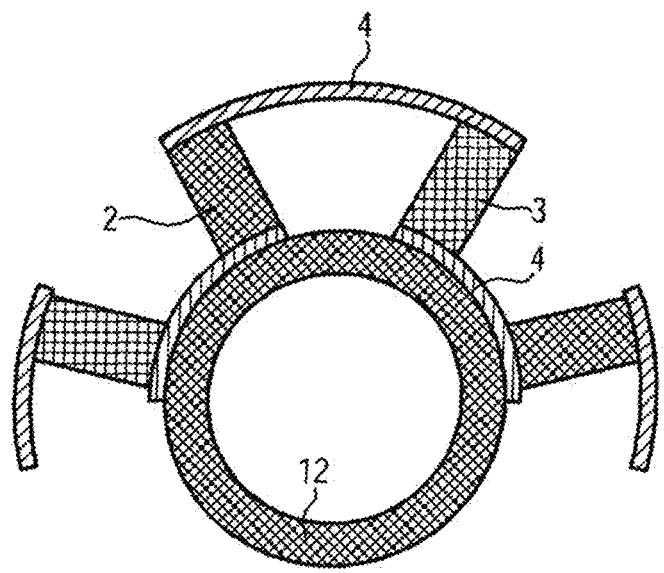
FIG. 3 is a schematic illustration showing a thermoelectric component arranged around a thermoconductor.

FIG. 3 is a schematic illustration showing a thermoelectric component 1 arranged around a thermoconductor 12. In contrast to the embodiment shown in FIG. 2, the embodiment of FIG. 3 is without any electrically insulating substrate 5 because the thermoconductor 12 itself is preferably electrically insulating. The thermoconductor 12 is, for example, tubular and preferably has a round cross-section. Preferably, the thermoelectric component 1 therefore has a curved, particularly annular or tubular shape.

It is particularly advantageous when the thermoelectric component 1 is mechanically flexible and can be adapted to the cross section of the thermoconductor 12. With the welds between the contact material 4 and the legs 2, 3 it is possible to adapt the flexible thermoelectric component 1 to different environments and installation situations because in contrast to conventional soldered joints the welded joints sustain substantially greater loads and are less prone to breakage.

Figure 4:
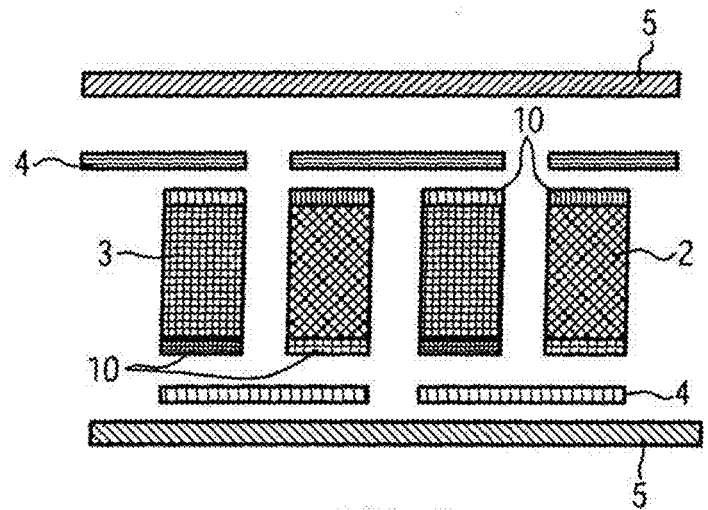
FIG. 4 is a schematic illustration showing a thermoelectric component of a flat construction.
Figure 5:
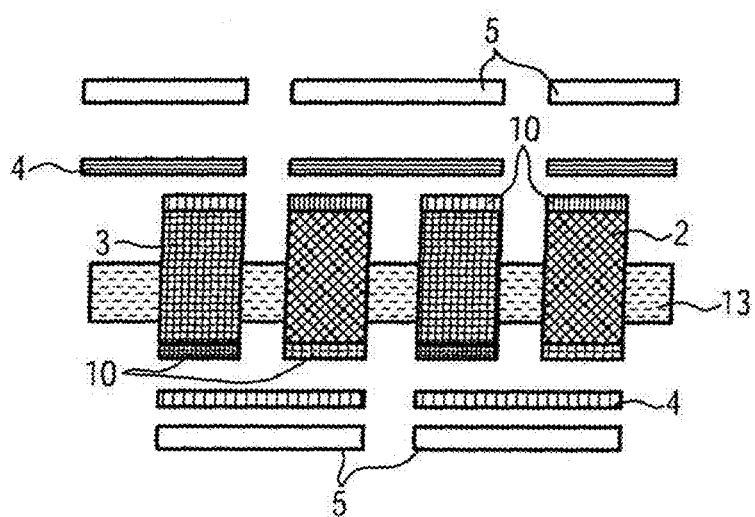
FIG. 5 is a schematic illustration showing a thermoelectric component of a flat construction with a mechanical stabilization.

Each of FIGS. 4 and 5 shows thermoelectric components 1 of a flat construction. The contact surfaces of the legs 2, 3 are each provided in their longitudinal direction L with diffusion barriers 10. In contrast to FIG. 4 the embodiment in FIG. 5 has no continuous, electrically insulating outer substrate 5, but comprises sections of the substrate 5. Each of the sections of the substrate 5 covers the strips of the electrically conductive contact material 4, so that an electrical insulation to the outside is ensured.

It is thus possible to deform the thermoelectric component 1 so as to adapt it to geometrically difficult installation situations. For reinforcing purposes a mechanical stabilization 13 is provided in the interior of the thermoelectric component 1, the stabilization enclosing the respective legs 2, 3 and separating neighboring legs from each other. This mechanical stabilization 13 can remain in the thermoelectric component 1, but can also be removed again after manufacture thereof. In the first-mentioned case it should not be electrically conductive and only show very poor thermal conduction; in the second case the thermal and electrical conductivity of the mechanical stabilization 13 plays no role.

When the mechanical stabilization 13 remains as a matrix material in the thermoelectric component 1, it serves not only stabilization, but also prevents, for example, contamination of or change in the chemical composition of the legs 2, 3. Preferably, ceramic materials, glasses, porcelain or plastic materials are used. Especially when elastically deformable plastic materials are used as the matrix material for the mechanical stabilization 13, it is possible to flexibly adapt the thermoelastic component 1 stabilized in this way to the installation situation.

Preferably, the contact material 4 has thicknesses between 1 µm and 1 mm and widths between 10 µm and 100 mm. To connect two legs 2, 3, one or several strips of the contact material 4 may be used side by side or one on top of the other.

FIGS. 6 to 9 are schematic illustrations showing a preferred method for producing a thermoelectric component 1. These figures show the thermoelectric component 1 or parts of the thermoelectric component 1 in a three-dimensional (perspective) view. The flat contact material 4 extends in FIGS. 8 and 9 along the base areas of the thermoelectric component 1 to be produced, i.e. along its length and width. Longitudinal axes of the legs 2, 3 define the height of the thermoelectric component 1 to be produced, the legs 2, 3 extending in FIG. 6 in longitudinal direction L.

Figure 6:
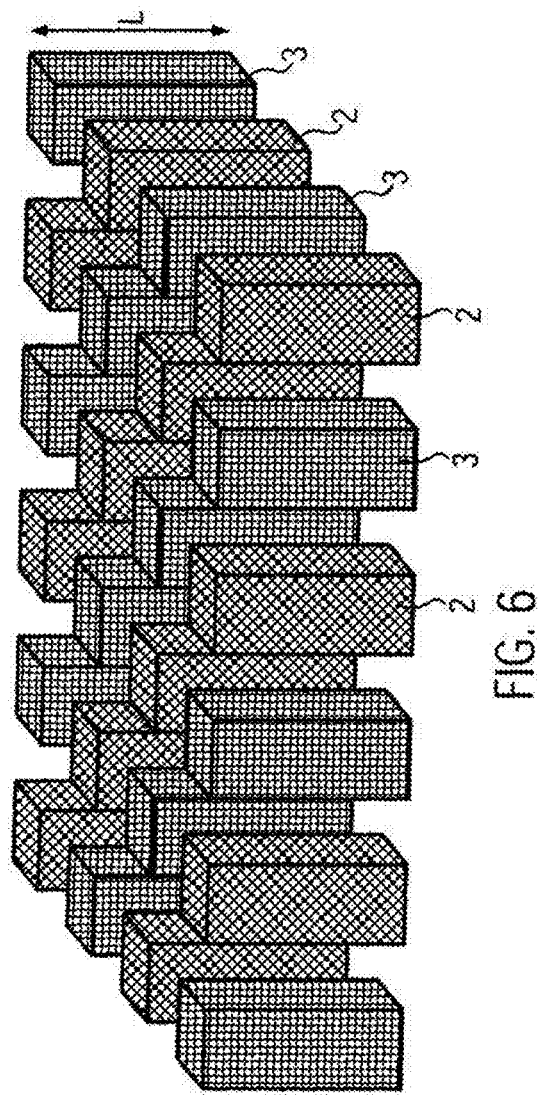
FIGS. 6-9 are schematic illustrations showing a method for producing a thermoelectric component.
Figure 7:
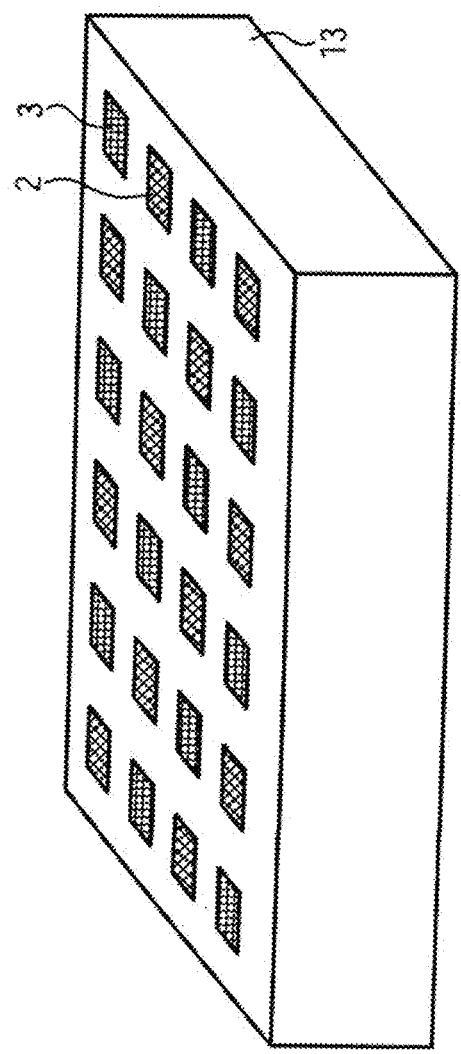
Figure 8:
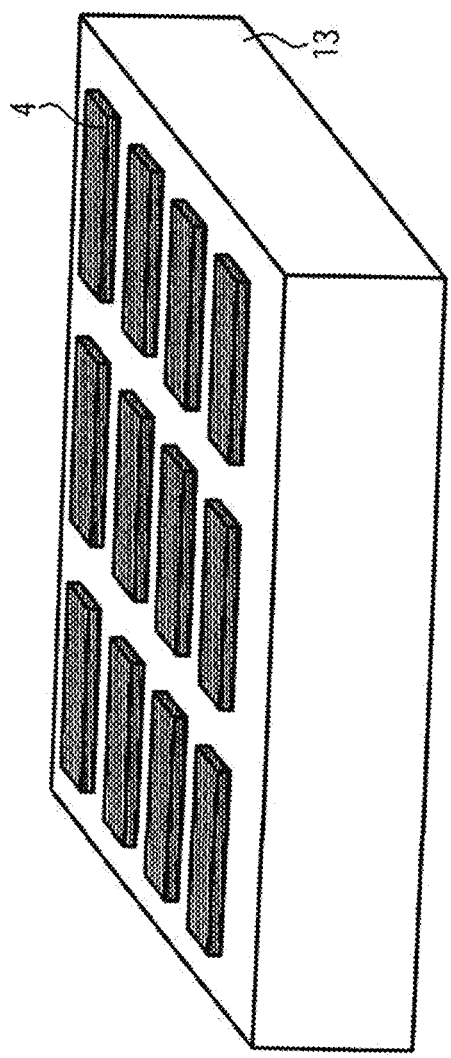

In FIG. 6, the n- and p-legs 2, 3 are already arranged, as desired, with a view to the later installation situation. It is here also possible to use legs 2, 3 with different leg lengths. As for the composition of the legs and their form, reference is made to the preceding description.

Subsequently, the legs 2, 3 are preferably surrounded by a matrix material as mechanical stabilization 13, as has been described above.

Previously described, electrically conductive contact material 4 is each time welded for connection of two neighboring n- and p-legs 2, 3 on the top side and on the bottom side (not shown) to the legs. n- and p-legs may be welded consecutively in time. It is also possible that all of the n- and p-legs 2, 3 are welded separately, but simultaneously to the contact material 4.

Preferably, the welding method used is resistance welding, such as gap welding, spot welding, projection welding or roll welding. Preferably, these welding methods are carried out in a protective gas atmosphere, either in an inert gas or in an active gas, to prevent contamination of the weld, particularly by oxides. Likewise, it is possible to carry out the welding method in vacuum.

Other welding methods, such as arc welding, gas shielded welding, laser beam welding, electron beam welding, plasma welding or hydrogen welding, are possible. Particularly advantageous is however gap welding, preferably narrow gap welding or inert-gas narrow-gap welding, which will still be discussed further below. MIG welding methods, either with inert gas or active gas, are advantageous. Tungsten inert-gas welding should particularly be mentioned here.

It is possible in all methods to preheat the legs 2, 3 to be welded and/or the contact material 4 prior to welding.

The welding operation accomplishes stable contacting with possible applications up to very high temperatures. Welding takes place by way of a short energy input into the contact material 4 and possibly into one or several materials positioned on top or underneath and into the leg material and possibly into one or several materials positioned thereabove.

With the welding method almost all material combinations of contact material and leg material and of the materials positioned on top or underneath can be connected to one another. This accomplishes high adhesion, and very high-melting materials can be connected at the same time, so that contacting satisfies the respective thermal demands. Moreover, contacts established with this technique are distinguished by high mechanical stability.

Since it is possible to join almost any material combinations of contact material and leg material and the corresponding layered structures by welding, the thermal expansion coefficient can be easily adapted and diffusion can be easily prevented by means of diffusion barriers. Differences in height of the individual legs do not play a role here. The welding process can be easily automated owing to its simplicity and achieves high reproducibility.

Figure 9:
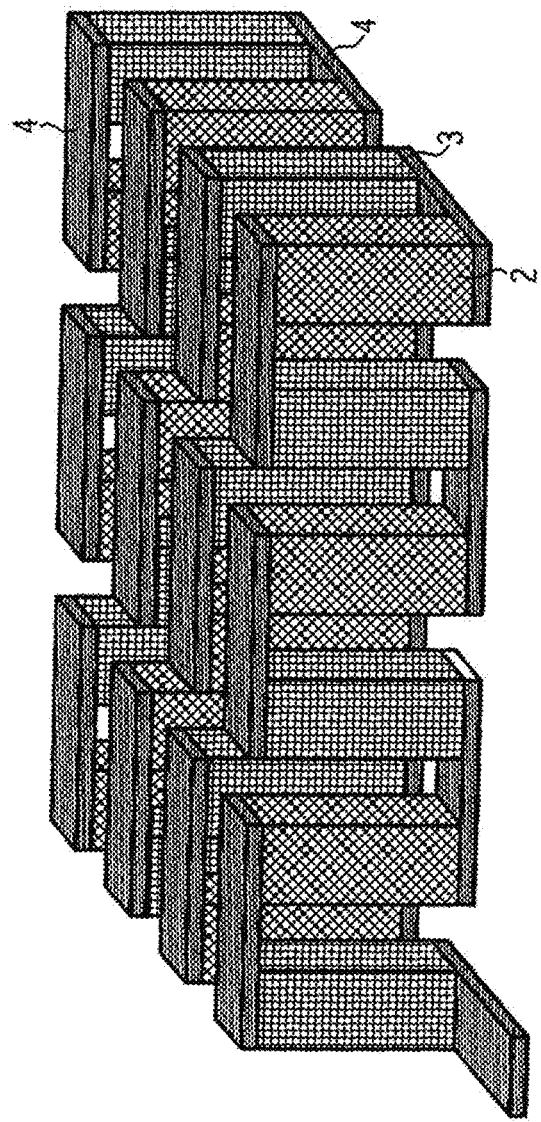

In FIG. 9, the optional mechanical stabilization 13 is removed if necessary. Subsequently, the thermoelectric component 1 may, for example, be provided on its top and bottom side with the above-described outer substrate 5.

Figure 10:
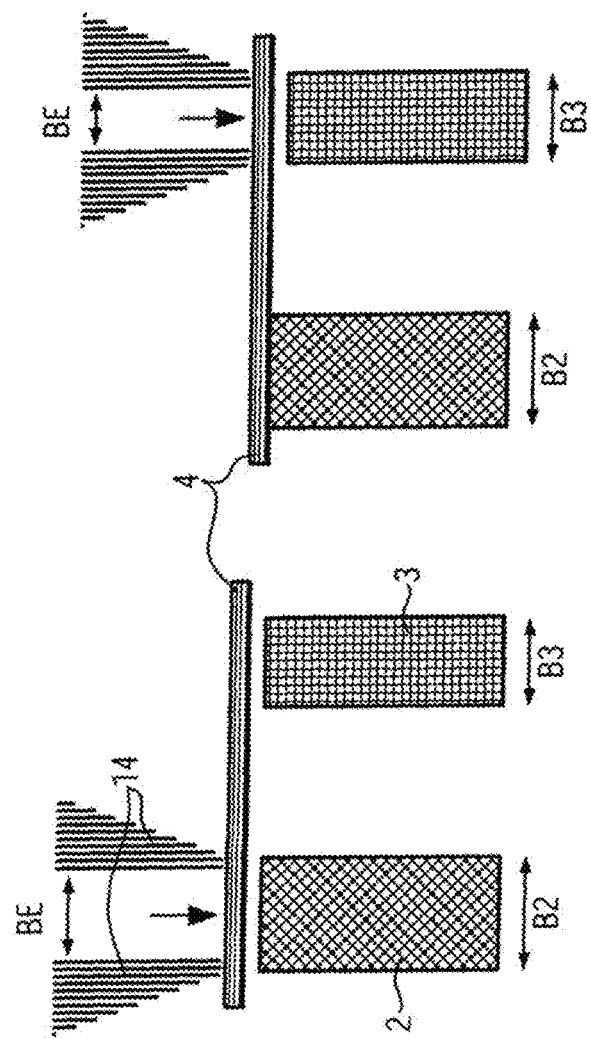
FIGS. 10-12 show different gap welds for contacting p- and n-legs with electrically conductive contact material.
Figure 11:
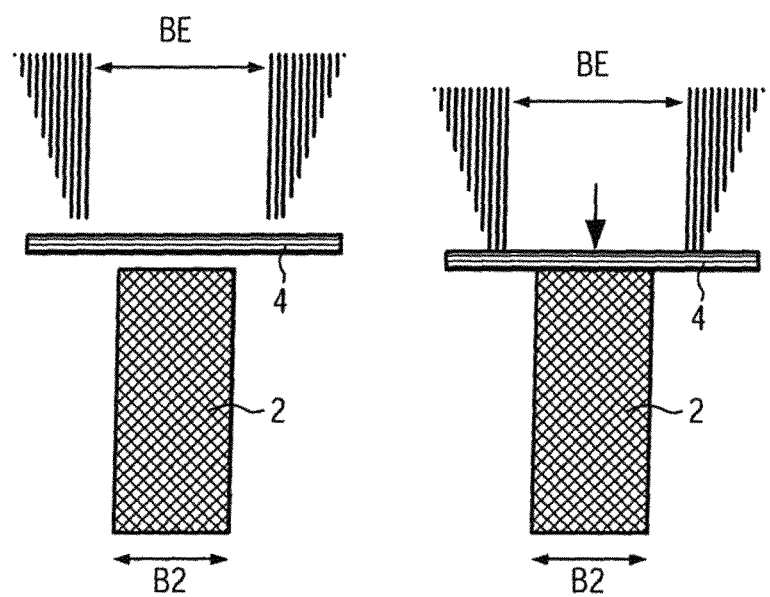
Figure 12:
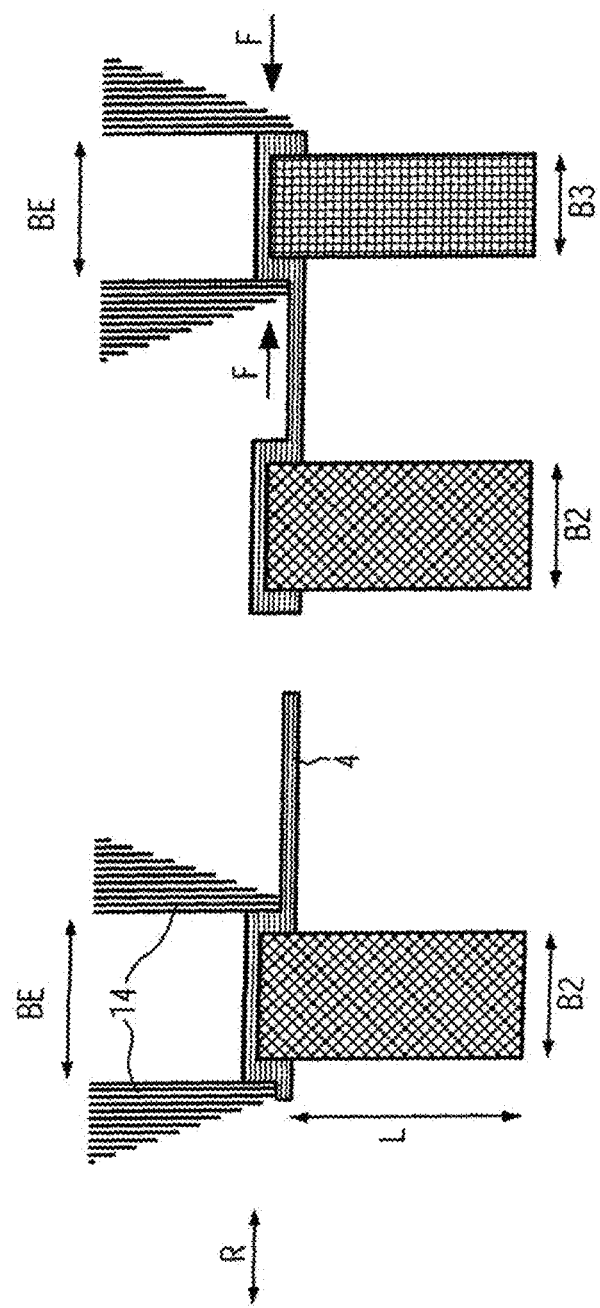

FIGS. 10 to 12 depict different gap welds for contacting the n- and p-legs 2, 3 with the electrically conductive contact material 4. Reference numeral 14 designates a gap electrode, the two electrode tips of which are spaced apart by a gap BE. The width of gap BE is variably adjustable. Preferably, the n-leg 2 and the p-leg 3 have different leg widths B2 and B3.

In the embodiment illustrated in FIG. 10, the gap BE of the gap electrode 14 is set according to the width B2 of the n-leg 2. The gap electrode 14 contacts the contact material 4 positioned on legs 2, 3 and presses the material preferably onto the leg 2 and 3, respectively, to be welded. However, it is also possible that the contact material 4 is pressed by other means already onto the respective leg 2, 3. The latter must particularly be borne in mind if contactless welding is carried out, for instance by means of laser beam welding or electron beam welding.

The contact surfaces or faces including legs 2, 3 at their ends in longitudinal direction L are brought into contact with the contact material and the respective leg is welded preferably across the whole contact surface of the leg 2, 3.

The electrodes, preferably the electrode tips of the gap electrode 14, are pressed at a contact pressure between 0.001 N/mm$^2$ and 10,000 N/mm$^2$ against the contact material 4 provided on the respective leg. For welding purposes current is flowing in the range of from 1 µA/mm$^2$ to 10 kA/mm$^2$ and between 1 ns and 10 s between the two electrodes through the contact material 4 and the leg to be respectively welded.

After the n-leg 2 has been welded at the left side of FIG. 10 in a first welding step, gap BE of the gap electrode 14 is set to the width B3 of the p-leg 3 located at the right side and is positioned above the leg. As an alternative, it is also possible to change the position of the thermoelectric component 1 accordingly.

For the second subsequent welding step further welding parameters, such as current flow, hold time, biasing current, heating-up period and/or contact pressure are matched in a corresponding way to the smaller p-leg 3, which is made up of a different material. It is also possible to change the welding tool itself and to adapt the welding parameters accordingly. Thus, different welding parameters are set independently of one another preferably for welding n- and p-legs 2, 3 with different geometry and/or different composition.

In a further preferred embodiment in FIG. 11, gap BE of the gap electrode 14 contacting the contact material 4 is set to be wider than the width B2 or B3 of the leg to be respectively welded.

While in FIGS. 10 and 11 the gap electrode 14 contacts the contact material 4 in longitudinal direction L of the leg 2, 3 to be welded, FIG. 12 shows a further embodiment in which the contact material encloses an end of the leg 2, 3 to be welded at least in part in a radial direction R of the leg 2, 3, i.e. in its width. The gap electrode 14 contacts the contact material 4 in radial direction R of the leg 2, 3 to be welded and acts on the contact material 4 with a force F in radial direction R.

To this end it is advantageous when the contact material 4 is pre-formed with corresponding recesses or hollows for the ends of legs 2, 3. However, it is also possible that these recesses are only formed by pressing a per se flat strip of contact material 4 onto the respective leg ends.

Independently of the selected welding method, it is advantageous when the thermoelectric component 1 comprises a plurality of pairs of legs so that, among a selection of pairs of legs, first the n-leg 2 and then the corresponding p-leg 3 are welded to the contact material 4, or vice versa. In case the thermoelectric component 1 comprises a plurality of pairs of legs, it is advantageous when all n-legs 2 or all p-legs 3 are welded to the contact material 4 at the same time. To be more specific, it is advantageous when all n-legs 2 of one side (top or bottom side of the thermoelectric component 1) or all p-legs 3 of one side are simultaneously welded to the contact material 4.

It is also possible that the contact material 4 is made up of several layers, preferably of different materials, that are connected, particularly welded, to each other and/or to the respective leg 2, 3. These multi-layered contact materials 4 preferably comprise foils, particularly coated foils. In this instance it is possible to connect or weld the multilayered contact material 4 in one or several welding steps to each other and/or to the corresponding leg 2, 3.

The previously described embodiments refer to a method for producing a thermoelectric component 1 with at least one pair of thermoelectric legs, including an n-leg 2 and a p-leg 3, both legs 2, 3 being welded to an electrically conductive contact material 4, the n-leg 2 and the p-leg 3 of the pair of legs being welded in separate welding steps to the contact material 4, and to a thermoelectric component 1.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a thermoelectric component comprising at least one pair of thermoelectric legs, including an n-leg (2) and a p-leg (3), the method comprising welding both legs (2, 3) to an electrically conductive contact material (4), wherein the n-leg (2) and the p-leg (3) of the at least one pair of thermoelectric legs are welded in separate welding steps to the contact material (4).

2. The method according to claim 1, wherein welding parameters for welding the n-leg (2) and welding parameters for welding the p-leg (3) are set independently of one another.

3. The method according to claim 1, wherein at least at one of their ends in a longitudinal direction (L) the legs (2, 3) comprise contact surfaces which are brought into contact with the contact material (4), and welding of the n-leg (2) and/or welding of the p-leg (3) is performed on the contact surface and/or at a side of the contact surface of the respective leg (2, 3).

4. The method according to claim 3, wherein welding of the n-leg (2) and/or welding of the p-leg (3) is performed over a whole contact surface of the respective leg (2, 3).

5. The method according to claim 1, wherein the contact material (4) comprises a plurality of layers, optionally of different materials, joined with each other and/or with the respective leg (2, 3) in one or more welding steps.

6. The method according to claim 1, wherein the contact material (4) or a layer provided thereon reacts physico-chemically with the material of the p-leg (3) and/or a reaction layer provided thereon and/or physico-chemically with the material of the n-leg (2) and/or a reaction layer provided thereon, and the reaction layer comprises at least one of the elements Ta, W, Mo, Nb, Ti, Cr, Pd, V, Pt, Rh, Re, Cu, Ag, Ni, Fe, Co, Al, In, Sn, Pb, Te, Sb, Bi, Se, S, Au, Zn, Si or Ge alone or in combination with another element.

7. The method according to claim 1, wherein prior to and/or during a respective welding step the contact material (4) is pressed onto the leg (2, 3) to be welded.

8. The method according to claim 7, wherein the contact material (4) is pressed by at least one welding electrode onto the leg (2, 3) to be welded.

9. The method according to claim 1, wherein the n-leg (2) and the p-leg (3) of the at least one pair of thermoelectric legs are welded by resistance welding separately to the contact material (4).

10. The method according to claim 9, wherein the n-leg (2) and the p-leg (3) of the at least one pair of thermoelectric legs are welded by gap welding to the contact material (4).

11. The method according to claim 10, wherein the contact material (4) is brought into contact with the corresponding leg (2, 3), and a gap (BE) of a gap electrode (14) contacting the contact material (4) is set in conformity with a width (B2, B3) of the leg (2, 3) to be welded.

12. The method according to claim 10, wherein the contact material (4) is brought into contact with the corresponding leg (2, 3), and a gap (BE) of a gap electrode (14) contacting the contact material (4) is set to be wider than a width (B2, B3) of the leg (2, 3) to be welded.

13. The method according to claim 12, wherein the contact material (4) encloses an end of the leg (2, 3) to be welded at least in part in a radial direction (R) of the leg (2, 3), and the gap electrode (14) contacts the contact material (4) in radial direction (R) of the leg (2, 3) to be welded.

14. The method according to claim 11, wherein the gap electrode (14) contacts the contact material (4) in a longitudinal direction (L) of the leg (2, 3) to be welded.

15. The method according to claim 1, wherein welding is performed under vacuum or in an inert gas atmosphere.

16. The method according to claim 1, wherein the n-leg (2) and/or the p-leg (3) of the at least one pair of thermoelectric legs is/are welded to the contact material (4) by inert gas welding selected from MIG welding, tungsten inert-gas welding, MAG welding, plasma welding or hydrogen welding.

17. The method according to claim 1, wherein the n-leg (2) and/or the p-leg (3) of the at least one pair of thermoelectric legs is/are welded to the contact material (4) by laser beam welding.

18. The method according to claim 1, wherein the legs (2, 3) to be welded and/or the contact material (4) are preheated prior to welding.

19. The method according to claim 1, wherein the thermoelectric component comprises a plurality of the at least one pair of thermoelectric legs, and wherein, among a selection of the plurality of pairs of thermoelectric legs, first the n-legs (2) and then the corresponding p-legs (3) are welded to the contact material (4).

20. The method according to claim 1, wherein the thermoelectric component comprises a plurality of the at least one pair of thermoelectric legs, and wherein, among a selection of the plurality of pairs of thermoelectric legs, first the p-legs (3) and then the corresponding n-legs (2) are welded to the contact material (4).

21. The method according to claim 1, wherein the thermoelectric component comprises a plurality of the at least one pair of thermoelectric legs, and all of the n-legs (2) are simultaneously welded to the contact material (4).

22. The method according to claim 1, wherein the thermoelectric component comprises a plurality of the at least one pair of thermoelectric legs, and all of the p-legs (3) are simultaneously welded to the contact material (4).

23. The method according to claim 1, wherein the n- and p-legs (2, 3) of the at least one pair of thermoelectric legs are electrically interconnected via the contact material (4) at one side of the thermoelectric component, and that at an opposite side of the thermoelectric component the n-leg (2) of the at least one pair of thermoelectric legs is electrically connected to another neighboring p-leg, and the p-leg (3) of the at least one pair of thermoelectric legs is electrically connected to another neighboring n-leg.

24. The method according to claim 23, wherein all of the n-legs (2) of one side are simultaneously welded to the contact material (4).

25. The method according to claim 23, wherein all of the p-legs (3) of one side are simultaneously welded to the contact material (4).

26. The method according to claim 1, wherein all of the n- and p-legs (2, 3) are welded separately, but simultaneously to the contact material (4).

* * * * *